United States Patent

Hu

(10) Patent No.: US 8,988,234 B2
(45) Date of Patent: Mar. 24, 2015

(54) ALARM SYSTEM

(75) Inventor: Ke-You Hu, Shenzhen (CN)

(73) Assignee: Zhongshan Innocloud Intellectual Property Services Co., Ltd., Guangdong (CN)

( * ) Notice: Subject to any disclaimer, the term of this patent is extended or adjusted under 35 U.S.C. 154(b) by 768 days.

(21) Appl. No.: 13/193,624

(22) Filed: Jul. 29, 2011

(65) Prior Publication Data

US 2012/0169506 A1 Jul. 5, 2012

(30) Foreign Application Priority Data

Dec. 31, 2010 (CN) .......................... 2010 1 0618336

(51) Int. Cl.
*G08B 21/00* (2006.01)
*G01R 31/02* (2006.01)

(52) U.S. Cl.
CPC .................................. *G01R 31/025* (2013.01)
USPC ........... 340/650; 340/500; 340/540; 340/635; 340/657; 340/658; 340/659; 340/660; 340/661; 340/662; 324/500; 324/508; 324/509; 324/512; 324/521; 324/522; 324/524; 361/42; 361/54; 361/88

(58) Field of Classification Search
None
See application file for complete search history.

(56) References Cited

U.S. PATENT DOCUMENTS

| | | | | |
|---|---|---|---|---|
| 3,774,189 A | * | 11/1973 | Brown | 340/655 |
| 4,626,834 A | * | 12/1986 | Caruthers | 340/649 |
| 2008/0042862 A1 | * | 2/2008 | Chen et al. | 340/649 |
| 2009/0282233 A1 | * | 11/2009 | Wang | 713/2 |
| 2010/0033883 A1 | * | 2/2010 | Simon | 361/52 |
| 2010/0328065 A1 | * | 12/2010 | Wang | 340/540 |

* cited by examiner

*Primary Examiner* — Curtis King

(74) *Attorney, Agent, or Firm* — Novak Druce Connolly + Quigg LLP

(57) ABSTRACT

An alarm system for alarming whenever there is a power leakage from an electronic device, includes a voltage decreasing circuit, a switch circuit and an alarm circuit. The voltage decreasing circuit receives a first voltage from a live wire output terminal and outputs a second voltage. The switch circuit outputs a control signal when the power leakage is detected. The switch circuit is electrically connected to a connection port. The connection port is electrically connected to the live wire output terminal and a neutral wire output terminal. The alarm circuit receives the control signal and alarms. If there is power leakage from the electronic device, the first voltage from the live wire input terminal flows into the ground wire input terminal via the electronic device; the switch circuit turns on and the alarm circuit is closed to alarm.

11 Claims, 2 Drawing Sheets

ALARM SYSTEM

BACKGROUND

1. Technical Field

The disclosure generally relates to alarm systems, and especially to an alarm system for alarming when there is a power leakage from an electronic device.

2. Description of Related Art

Typically, computers have metal enclosures, and are connected to a 220V power source during usage. If the computer is not well grounded, the computer enclosure may experience static electricity, that is, power leakage, thereby affecting users' safety. Under normal circumstances, the computer power supply is connected to a city power source socket with good grounding to conduct the static electricity to ground, thereby ensuring the safety of the computer. However, the computer may be in an unsafe power environment and connected to a power source with improper grounding. As a result, computers may experience power leakage, thereby damaging the computer's motherboard as well as putting the safety of users at risk.

Therefore there is a room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
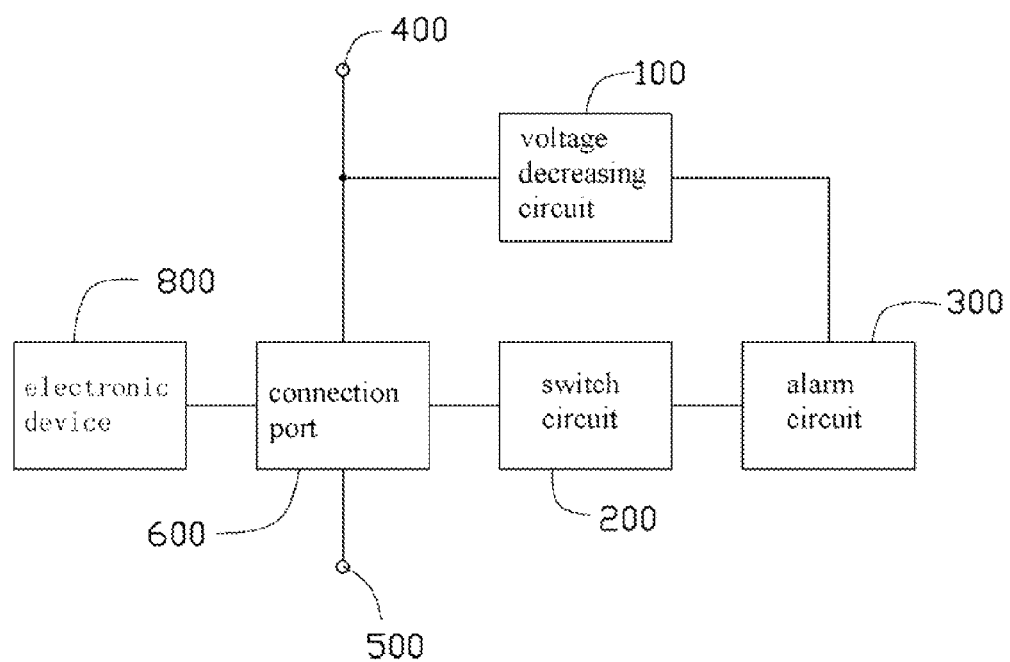
FIG. 1 is a block view of an embodiment of an alarm system.

Referring to FIG. 1, an embodiment of an alarm system for alarming when there is a power leakage from an electronic device 800, includes a voltage decreasing circuit 100, a switch circuit 200 and an alarm circuit 300.

The voltage decreasing circuit 100 receives a first voltage from a live wire output terminal 400 and outputs a second voltage which is provided to the alarm circuit 300. The switch circuit 200 is electrically connected to a connection port 600. The connection port 600 is electrically connected to the live wire output terminal 400 and a neutral wire output terminal 500. The switch circuit 200 outputs a control signal when the power leakage is detected. The alarm circuit 300 alarms after receiving the control signal. The connection port 600 is electrically connected to the electronic device 800 to provide power supply for the electronic device 800. In one embodiment, the first voltage is 220 volts.

Figure 2:
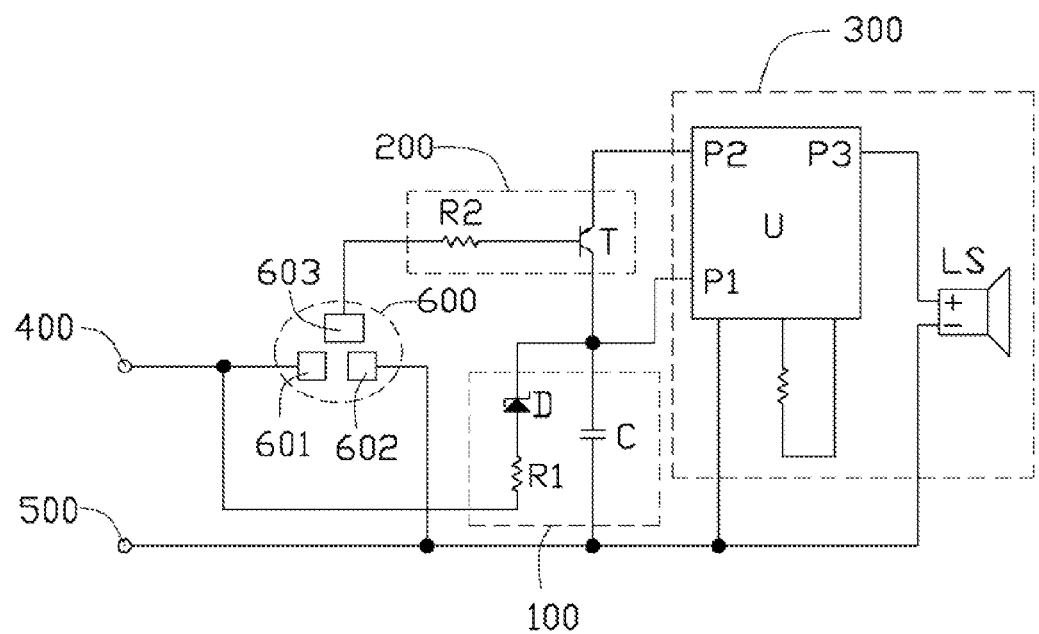
FIG. 2 is a circuit view of the embodiment of FIG. 1.

Referring to FIG. 2, the voltage decreasing circuit 100 includes a first resistor R1, a zener diode D and a capacitor C. The first resistor R1 includes a first resistor first terminal and a first resistor second terminal. The zener diode D includes a zener diode anode and a zener diode cathode. The first resistor first terminal is electrically connected to the live wire output terminal 400 for receiving the first voltage. The first resistor second terminal is electrically connected to the zener diode anode. The zener diode cathode outputs the second voltage. The zener diode cathode is electrically connected to the neutral wire output terminal 500 via the capacitor C.

The switch circuit 200 includes a second resistor R2 and a transistor T. The connection port 600 includes a live wire input terminal 601, a neutral wire input terminal 602, and a ground wire input terminal 603. The second resistor R2 includes a second resistor first terminal and a second resistor second terminal. The transistor T includes a transistor base, a transistor emitter, and a transistor collector. The second resistor first terminal is electrically connected to the ground wire input terminal 603. The second resistor second terminal is electrically connected to the transistor base. The transistor collector is electrically connected to a connection point between the zener diode D and the capacitor C. The transistor emitter outputs the control signal. In one embodiment, the transistor T is a NPN type transistor.

The alarm circuit 300 includes an audio signal processing chip U and a buzzer LS. The audio signal processing chip U includes a voltage input terminal P1, a control signal input terminal P2 and an alarm signal output terminal P3. The voltage input terminal P1 is electrically connected to the zener diode cathode for receiving the second voltage. The control signal input terminal P2 is electrically connected to the transistor collector for receiving the control signal. The alarm signal output terminal P3 is electrically connected to the neutral wire output terminal 500 via the buzzer LS for outputting an alarm signal.

In use, if there is no power leakage from the electronic device 800, the first voltage from the live wire input terminal 601 will flow into the neutral wire input terminal 602 via the electronic device 800. The transistor base cannot receive the first voltage. Then, the transistor T turns off. The audio signal processing chip U is an open circuit and outputs a low voltage level alarm signal. The buzzer LS does not buzz. If there is power leakage from the electronic device 800, the first voltage from the live wire input terminal 601 would flow into the ground wire input terminal 603 via the electronic device 800. The transistor base will then receive the first voltage. The transistor T turns on. The audio signal processing chip U is a closed circuit and outputs a high voltage level alarm signal. The buzzer LS buzzes to alarm.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An alarm system for alarming when there is a power leakage from an electronic device, comprising:
    a voltage decreasing circuit adapted to receive a first voltage from a live wire output terminal and output a second voltage;
    a switch circuit adapted to output a control signal when the power leakage is detected; wherein the switch circuit is electrically connected to a connection port; the connection port is electrically connected to the live wire output terminal and a neutral wire output terminal; and an alarm circuit adapted to receive the control signal and alarms; wherein the second voltage is provided to the alarm circuit; the connection port is electrically connected to the electronic device to provide power supply for the electronic device; wherein the voltage decreasing circuit comprises a first resistor, a zener diode, and a capacitor; the first resistor comprises a first resistor first terminal and a first resistor second terminal; the zener diode comprises a zener diode anode and a zener diode cathode; the first resistor first terminal is electrically connected to the live wire output terminal for receiving the first voltage; the first resistor second terminal is electrically connected to the zener diode anode; the zener diode cathode is adapted to output the second voltage; the zener diode cathode is electrically connected to the neutral wire output terminal via the capacitor; the switch circuit comprises a second resistor and a transistor; the connection port comprises a live wire input terminal, a neutral wire input terminal and a ground wire input terminal; the second resistor comprises a second resistor first terminal and a second resistor second terminal; the transistor comprises a transistor base, a transistor emitter and a transistor collector; the second resistor first terminal is electrically connected to the ground wire input terminal; the second resistor second terminal is electrically connected to the transistor base; the transistor collector is electrically connected to a connection point between the zener diode and the capacitor; and the transistor emitter is adapted to output the control signal.

2. The alarm system of claim 1, wherein the transistor is a NPN type transistor.

3. The alarm system of claim 1, wherein the alarm circuit comprises an audio signal processing chip and a buzzer; the audio signal processing chip comprises a voltage input terminal, a control signal input terminal and an alarm signal output terminal; the voltage input terminal is electrically connected to the zener diode cathode for receiving the second voltage; the control signal input terminal is electrically connected to the transistor collector for receiving the control signal; and the alarm signal output terminal is electrically connected to the neutral wire output terminal via the buzzer for outputting an alarm signal.

4. The alarm system of claim 3, wherein if there is power leakage from the electronic device, the first voltage from the live wire input terminal is adapted to flow into the ground wire input terminal via the electronic device; the transistor base is adapted to receive the first voltage; the transistor is adapted to turn on; the audio signal processing chip is closed circuit and is adapted to output a high voltage level alarm signal; and the buzzer LS is adapted to buzz for alarming 5. The alarm system of claim 3, wherein if there is no power leakage from the electronic device, the first voltage from the live wire input terminal is adapted to flow into the neutral wire input terminal via the electronic device; the transistor base cannot receive the first voltage; the transistor is adapted to turn off; the audio signal processing chip is open circuit and is adapted to output a low voltage level alarm signal; and the buzzer does not buzz.

6. An alarm system for alarming when there is a power leakage from an electronic device, comprising:
a voltage decreasing circuit adapted to receive a first voltage from a live wire output terminal and output a second voltage;
a switch circuit adapted to output a control signal when the power leakage is detected; wherein the switch circuit is electrically connected to a connection port; the connection port comprises a live wire input terminal, a neutral wire input terminal and a ground wire input terminal; the live wire input terminal and the neutral wire input terminal are electrically connected to the live wire output terminal and a neutral wire output terminal respectively; and
an alarm circuit adapted to receive the control signal and alarms; wherein if there is power leakage from the electronic device, the first voltage from the live wire input terminal is adapted to flow into the ground wire input terminal via the electronic device; the switch circuit is adapted to turn on; and the alarm circuit is closed to alarm; wherein the switch circuit comprises a second resistor and a transistor; the second resistor comprises a second resistor first terminal and a second resistor second terminal; the transistor comprises a transistor base, a transistor emitter and a transistor collector; the second resistor first terminal is electrically connected to the ground wire input terminal; the second resistor second terminal is electrically connected to the transistor base; the transistor collector is electrically connected to a connection point between the live wire input terminal and the live wire output terminal; and the transistor emitter is adapted to output the control signal.

7. The alarm system of claim 6, wherein the voltage decreasing circuit comprises a first resistor and a zener diode; the first resistor comprises a first resistor first terminal and a first resistor second terminal; the zener diode comprises a zener diode anode and a zener diode cathode; the first resistor first terminal is electrically connected to the live wire output terminal for receiving the first voltage; the first resistor second terminal is electrically connected to the zener diode anode; and the zener diode cathode is adapted to output the second voltage.

8. The alarm system of claim 7, wherein the voltage decreasing circuit further comprises a capacitor; and the zener diode cathode is electrically connected to the neutral wire output terminal via the capacitor.

9. The alarm system of claim 6, wherein the transistor is a NPN type transistor.

10. The alarm system of claim 7, wherein the alarm circuit comprises an audio signal processing chip and a buzzer; the audio signal processing chip comprises a voltage input terminal, a control signal input terminal and an alarm signal output terminal; the voltage input terminal is electrically connected to the zener diode cathode for receiving the second voltage; the control signal input terminal is electrically connected to the transistor collector for receiving the control signal; and the alarm signal output terminal is electrically connected to the neutral wire output terminal via the buzzer for outputting an alarm signal.

11. The alarm system of claim 10, wherein if there is no power leakage from the electronic device, the first voltage from the live wire input terminal is adapted to flow into the neutral wire input terminal via the electronic device; the transistor base cannot receive the first voltage; the transistor is adapted to turn off; the audio signal processing chip is open circuit and is adapted to output a low voltage level alarm signal; and the buzzer does not buzz.

* * * * *